(12) United States Patent
Stenberg

(10) Patent No.: US 7,110,560 B2
(45) Date of Patent: Sep. 19, 2006

(54) ELECTRET CONDENSOR MICROPHONE PREAMPLIFIER THAT IS INSENSITIVE TO LEAKAGE CURRENTS AT THE INPUT

(75) Inventor: Lars J. Stenberg, Roskilde (DK)

(73) Assignee: Sonion A/S, (DK)

( * ) Notice: Subject to any disclaimer, the term of this patent is extended or adjusted under 35 U.S.C. 154(b) by 559 days.

(21) Appl. No.: 10/092,613

(22) Filed: Mar. 8, 2002

(65) Prior Publication Data
US 2002/0125949 A1 Sep. 12, 2002

Related U.S. Application Data

(60) Provisional application No. 60/274,248, filed on Mar. 9, 2001.

(51) Int. Cl.
*H04R 3/00* (2006.01)
*H03F 21/00* (2006.01)

(52) U.S. Cl. .................. 381/113; 381/111; 381/120

(58) Field of Classification Search ........ 381/111–115, 381/120
See application file for complete search history.

(56) References Cited

U.S. PATENT DOCUMENTS

| | | | |
|---|---|---|---|
| 3,286,189 A | | 11/1966 | Mitchell et al. |
| 5,577,129 A | * | 11/1996 | Ehara .................. 381/113 |
| 5,589,799 A | * | 12/1996 | Madaffari et al. ........... 330/277 |
| 5,973,368 A | * | 10/1999 | Pearce et al. ............... 257/368 |
| 6,088,463 A | * | 7/2000 | Rombach et al. .......... 381/174 |
| 6,218,883 B1 | | 4/2001 | Takeuchi .................. 327/318 |
| 6,275,593 B1 | * | 8/2001 | Garcia et al. ................. 381/98 |
| 6,448,599 B1 | * | 9/2002 | Wang ......................... 257/300 |
| 6,453,048 B1 | * | 9/2002 | Akino ....................... 381/113 |
| 6,516,069 B1 | * | 2/2003 | Takeuchi et al. ........... 381/122 |
| 6,731,763 B1 | * | 5/2004 | Dent .......................... 381/114 |
| 6,812,788 B1 | * | 11/2004 | Kern ........................... 330/69 |

FOREIGN PATENT DOCUMENTS

| | | |
|---|---|---|
| DE | 19937990 A1 | 5/2000 |
| EP | 1 039 545 | 6/2000 |
| JP | 11-317996 | 11/1999 |
| WO | WO 94/23547 | 10/1994 |
| WO | WO 00/27166 | 5/2000 |

OTHER PUBLICATIONS

International Search Report, PCT/DK 02/00147, Sep. 13, 2000.

* cited by examiner

*Primary Examiner*—Laura A. Grier
(74) *Attorney, Agent, or Firm*—Harness, Dickey & Pierce

(57) ABSTRACT

A preamplifier having extremely high input impedance amplifies the electrical signal output from an electret condenser microphone (ECM) without suffering from the effects of a DC leakage current at the input. The preamplifier circuit includes a pair of cross-coupled PN junction diodes setting the input impedance, a PMOS device, and a load resistor configured similarly to a conventional preamplifier. A capacitor is placed between the input and the cross-coupled diodes such that a DC path no longer exists to bias the cross-coupled diodes. Therefore, leakage currents are prevented from upsetting the DC operating point of the preamplifier and biasing the cross-coupled diodes. Consequently, small signal gain distortion, excessive demodulation products and increased noise can be avoided.

14 Claims, 2 Drawing Sheets

ELECTRET CONDENSOR MICROPHONE PREAMPLIFIER THAT IS INSENSITIVE TO LEAKAGE CURRENTS AT THE INPUT

This application claims priority to U.S. Provisional Application No. 60/274,248, filed on Mar. 9, 2001, the entire contents of which are hereby incorporated by reference.

FIELD OF THE INVENTION

The present invention relates to an amplifier circuit for a condenser microphone, especially to a high-impedance preamplifier circuit that amplifies the electric signal of an electret condenser microphone and which is insensitive to leakage currents at the input.

DESCRIPTION OF THE RELATED ART

Condenser microphones are a type of microphone having a very flat frequency response, low noise, and low cost. Condenser microphones generally weigh less and can be much smaller than other kinds of microphones. These characteristics make condenser microphones the logical choice for applications requiring miniature microphones, such as hearing aids, mobile telephones and portable tape recorders.

A condenser microphone includes a lightweight membrane, or diaphragm, and a fixed plate, or backplate, arranged as a parallel plate structure. This parallel plate structure acts as a condenser, i.e., a capacitor. Sound waves propagating toward the diaphragm cause the diaphragm to deflect in accordance with the amplitude and phase of the sound waves, resulting in a change of spacing between the plates. As the spacing changes, the capacitance of the parallel plate structure changes, and for small capacitance changes ($\Delta C$), this creates approximately proportional potential changes ($\Delta V$) between the capacitor plates that varies according to the incoming sound waves, assuming the electrical charge (Q) in the capacitor is kept constant, i.e., $V+\Delta V=Q/(C+\Delta C)$.

The polarizing voltage required for the capacitive circuit in the condenser microphone can be supplied by an external power source, such as a battery. However, one type of condenser microphone, known as an electret condenser microphone (ECM), avoids the need, and expense, of adding an external power source by using a permanently polarized electret material for the membrane or the fixed plate.

A preamplifier circuit is used to amplify the output charge, or voltage, of the condenser microphone to an appropriate level for its intended purpose. However, the preamplifier must have an extremely high electrical impedance to obtain a flat frequency response and ensure the lowest possible noise and a low output impedance to match the impedance of subsequent amplifier circuits. Field effect transistors (FETs) have been used in preamplifier circuits in order to boost the signal output of condenser microphones and act as impedance converters.

For years, a common preamplifier design for use with ECMs included an n-channel junction field effect transistor (NJFET) 12, as shown in FIG. 1. The preamplifier circuit 10 includes a resistor HiZ (usually on the order of one GigaOhm). The circuit of FIG. 1 also includes a load resistor $R_L$. Simplicity and relatively low cost contributed to the popularity of this design choice for preamplifiers. Another contributing factor was the fact that JFET transistors were less affected by flicker noise than other FET transistors, such as MOSFETs (although, MOSFETs and in particular P-type MOSFETs (PMOS) have since been improved and now exhibit satisfactory characteristics with respect to flicker noise). One drawback with this preamplifier circuit is the difficulty of achieving an input impedance on the order of GigaOhms using a resistor. Therefore, the circuit is limited as to its ability to suppress signal noise.

More recently, improvements to the preamplifier circuit design of FIG. 1 have been made. Specifically, resistor HiZ has been replaced with two small-area cross-coupled PN-junction diodes, and the n-channel JFET 12 has been replaced with a PMOS device. The input impedance of the resulting PMOS preamplifier can then reach the order of hundreds or thousands of GigaOhms.

However, a drawback of the PMOS preamplifier is that it generally suffers from a high sensitivity to leakage currents at its input. Such a leakage current may, for example, originate from surface contamination on various insulating materials used in the microphone assembly. Even leakage currents below 1 pA can easily upset the biasing point of the circuit, as well as cause an increased input capacitance (due to the cross-coupled diodes), thereby lowering the signal-to-noise ratio (SNR). Furthermore, a leakage current flowing through the small biasing diodes will move the operating point of the diodes away from 'zero bias'. Due to the exponential nature of diode I(V) characteristics, this causes increased distortion of the desired signal and an increased content of RF signal demodulation products in the signal, in case the microphone is exposed to electro-magnetic interfering signals.

It would therefore be advantageous to prevent DC leakage currents at the input that affect the DC operating point and the small signal gain of the preamplifier of such preamplifier circuits.

SUMMARY OF THE INVENTION

A preferred embodiment of the present invention is directed to a preamplifier having extremely high input impedance, which amplifies the electrical signal output from an electret condenser microphone (ECM) without suffering from the effects of a DC leakage current at the input. The input stage of the PMOS preamplifier circuit includes a pair of cross-coupled PN junction diodes setting the input impedance and a PMOS device. Further, the PMOS preamplifier circuit of the present invention includes a low leakage capacitor inserted between the input and the cross-coupled diodes such that a DC path no longer exists to bias the cross-coupled diodes.

In a further embodiment, the capacitor blocks the DC path extending from the output of the condenser microphone to a DC input of the preamplifier circuit, thereby preventing leakage currents at the input of the preamplifier circuit.

In a further embodiment of the present invention, the preamplifier is implemented as a monolithic chip, and the capacitor is implemented external to the chip.

In a further embodiment of the present invention, the preamplifier circuit is implemented as a monolithic chip, and the capacitor is integrated into the chip.

In a further embodiment of the present invention, the preamplifier circuit is integrated as a monolithic chip using any of PMOS, NMOS, CMOS, JFET, MESFET, or similar technology.

In a further embodiment of the present invention, the capacitance value of the capacitor is determined in relation to the capacitance of the ECM, such that the capacitor does not influence the signal gain of the ECM.

In a further embodiment of the present invention, the PMOS preamplifier including a capacitor is used for amplifying the signal of non-electret condenser microphones, such as silicon-based condenser microphones, in order to reduce an input leakage current.

BRIEF DESCRIPTION OF THE DRAWINGS

These and other objects and features of the present invention will become apparent from the following detailed description considered in connection with the accompanying drawings. It is to be understood, however, that these drawings are designed for purposes of illustration only and not as a definition of the limits of the invention for which reference should be made to the appending claims.

DETAILED DESCRIPTION OF THE INVENTION

Figure 1:
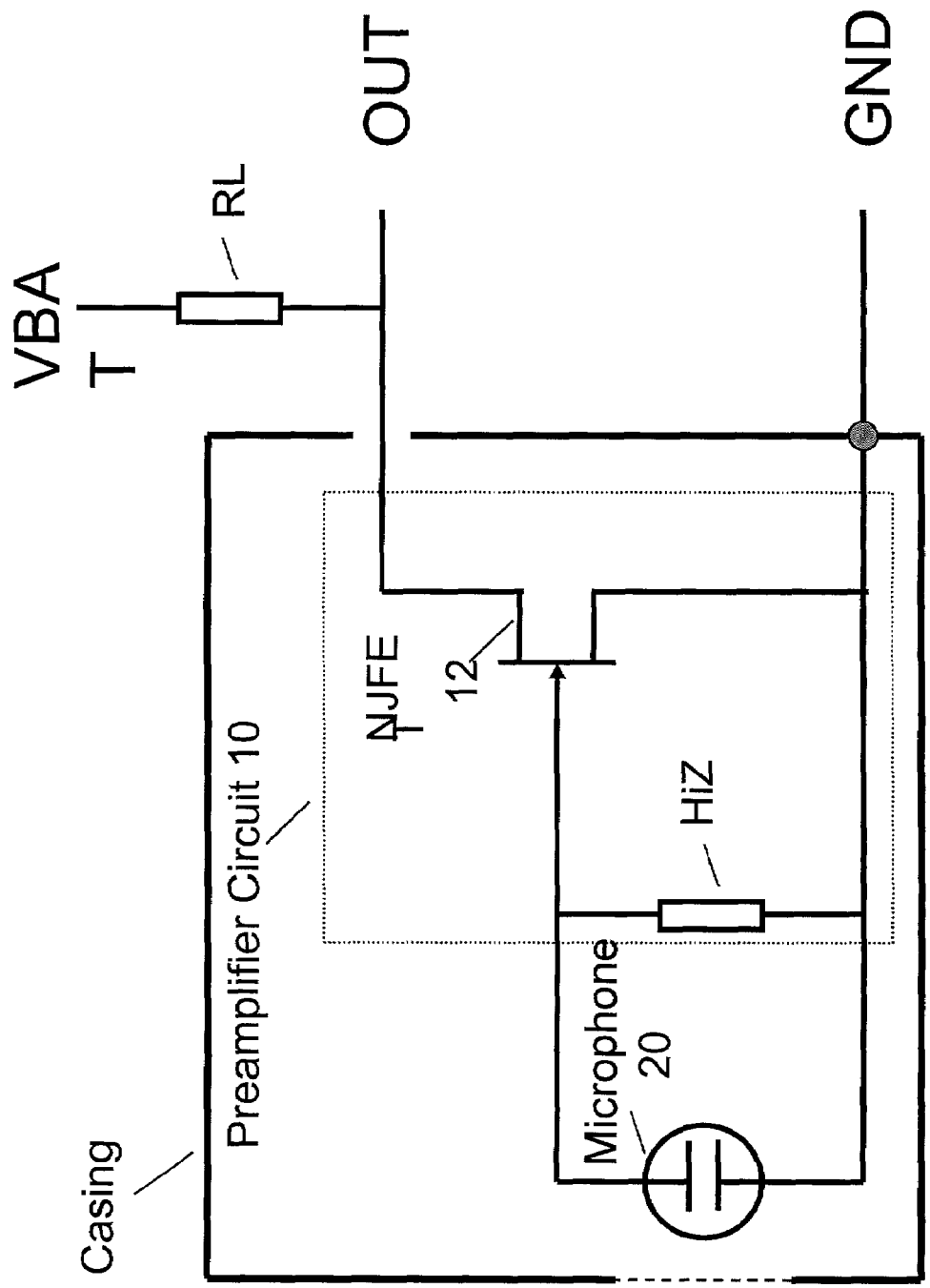
FIG. 1 is a schematic diagram of a conventional preamplifier circuit for ECMs.
Figure 2:
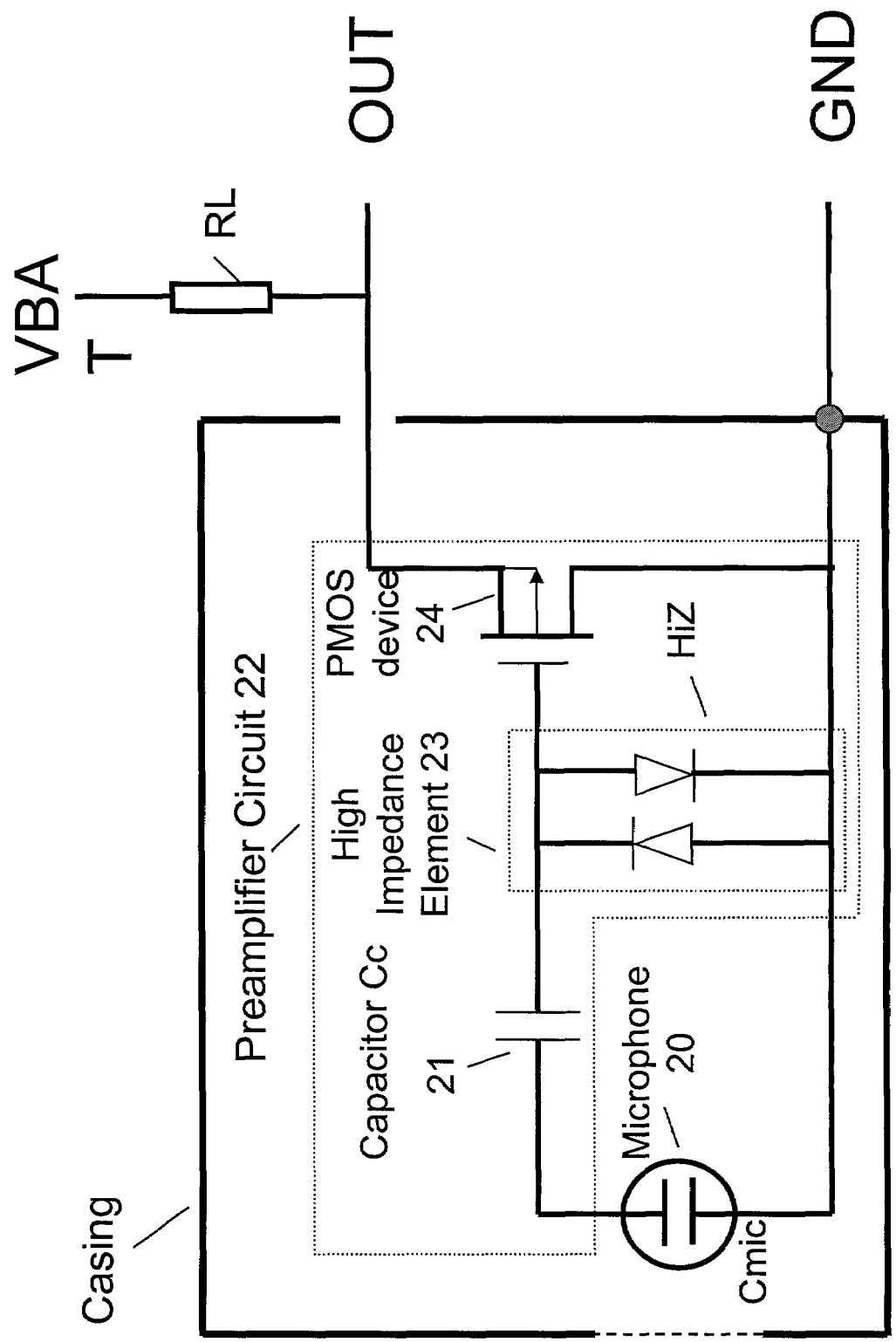
FIG. 2 is a schematic diagram of a preamplifier circuit according to a preferred embodiment of the present invention.

Referring to the drawings, FIG. 2 shows a preferred embodiment of the present invention. An electrical signal of a condenser microphone 20 (an ECM, according to a preferred embodiment) is input to preamplifier circuit 22 via capacitor 21 having capacitance $C_C$. Due to its parallel plate construction, the condenser microphone has an associated capacitance $C_{MIC}$.

The preamplifier circuit 22, in a preferred embodiment, includes a high impedance element 23 including a pair of cross-coupled small-area PN junction diodes, and a PMOS device 24. The cross-coupled diode configuration allows high-impedance element 23 to set an input impedance for the preamplifier circuit 22 up to the order of hundreds or thousands of GigaOhms. A load resistor $R_L$ is connected between the source of the PMOS device and an external voltage source $V_{BAT}$. It is noted that FIG. 2 shows a preferred embodiment and is not limiting. The preamplifier can be implemented using a JFET, N-Type MOSFET (NMOS), or MESFET in place of the PMOS device 24, or using any other technology that is well known in the art. In addition, any other high-impedance element known to those of ordinary skill in the art could be used in place of the cross-coupled diodes, such as a resistor having a high resistance value, usually on the order of one GigaOhm. However, it is noted that resistors do not provide as high an input impedance as the cross-coupled diodes, and that it is difficult to set an input impedance of 100 GigaOhms using a resistor.

The placement of capacitor 21 effectively prevents DC leakage currents from upsetting the bias point of the preamplifier and thereby affecting the small signal gain of the preamplifier, by blocking the DC path from the output of condenser microphone 20 to the PMOS device 24. In addition, the capacitor 21 will prevent an increase of the input capacitance by preventing DC leakage currents flowing through the diodes 23. Therefore, attenuation of the microphone signal caused by increases in the input capacitance, excessive distortion and non-linearity of the preamplifier can be eliminated.

The capacitance $C_C$ of capacitor 21 is set such that the capacitor will not affect the signal gain from the microphone 20. Therefore, capacitance $C_C$ should be significantly higher than the capacitance $C_{MIC}$ of the microphone 20. Preferably, $C_C$ is in the range of 1 to 100 times larger than $C_{MIC}$, more preferably 5 to 50 times larger than $C_{MIC}$, and more preferably 10 times greater than $C_{MIC}$. If capacitance $C_C$ is set too low, then the blocking capacitor will not act as a low impedance AC coupling to the input, and $C_C$ will therefore attenuate the signal. However, if $C_C$ is set too high, the capacitor may become too large to implement on certain types of integrated circuits and the intrinsic leakage of the capacitor may become excessive.

The capacitor 21 can be implemented as a variety of different capacitor types, including: polysilicon-to-diffusion, metal-to-diffusion, polysilicon-to-polysilicon, metal-to-polysilicon, or metal-to-metal. Of course, the above list is only meant to illustrate different examples of capacitors that can be used as the capacitor 21, and is in no way meant to limit the capacitor 21 to one of these capacitor types. It is preferred that the capacitor 21 be constructed of low leakage floating plates and be compatible with modern integrated circuitry technology (e.g., CMOS, JFET, P or N type MOSFET, or MESFET).

In a preferred embodiment, the preamplifier circuit 22 is implemented as a monolithic chip and DC blocking capacitor 21 is implemented as an element external to the monolithic chip. Such an arrangement reduces the costs of production because a chip having a smaller area is produced. Further, this arrangement allows the capacitance $C_C$ of the capacitor 21 to be set very high.

In another preferred embodiment, both the preamplifier circuit 22 and the capacitor 21 are integrated as a monolithic circuit. This arrangement, while it might be more expensive to manufacture, has a performance advantage over the embodiment in which capacitor 21 is implemented external to the monolithic circuit. The macro device produced by implementing the capacitor 21 outside of the preamplifier monolithic circuit is more susceptible to leakage currents.

As described above, in a preferred embodiment, the capacitor 21 and preamplifier circuit 22 arrangement of the present invention are used for amplifying the electrical signal from an ECM. However, the present invention can also be used to enable DC biasing of other types of microphones, including silicon-based condenser microphones, while reducing current leakage and distortion and improving attenuation of the microphone signal.

In case a leakage current is present at the input of preamplifier circuit 22, a current path to ground should be provided. Such current path may be established via a high ohmic impedance. This leakage current path may be separated from the biasing circuit of preamplifier circuit 22.

As mentioned above, FIG. 2 is indicative of a preferred embodiment of invention and is in no way limiting. The preamplifier circuit 22 shown in FIG. 2 is merely exemplary of the type of preamplifier circuit that can be used in the invention, and may be replaced with any one of a plurality of equivalent circuit configurations known to those of ordinary skill in the art.

The present invention has been described with reference to the preferred embodiments. As will be evident to those skilled in the art, various modification of this invention can be made or followed in light of the foregoing disclosure without departing from the spirit and scope of the claims.

The invention claimed is:

1. A preamplifier circuit for amplifying an electrical signal from an electret condenser microphone transducer, comprising:

a series capacitor connected to an output of an electret condenser microphone and a DC input of an input amplifier stage of the preamplifier circuit, wherein the input amplifier stage includes an input impedance circuit, including a pair of cross-coupled, small area PN junction diodes, which sets the input impedance of the input amplifier stage as substantially equal to or greater than 1 GigaOhm, wherein the capacitor reduces current leakages by blocking a DC path from the output of the electret condenser microphone to the input amplifier stage.

2. The preamplifier circuit according to claim 1, wherein the input amplifier stage is integrated as a monolithic chip and the capacitor is provided externally.

3. The preamplifier circuit according to claim 1, wherein the input amplifier stage and the capacitor is integrated as a monolithic chip.

4. The preamplifier circuit according to claim 3, wherein the monolithic chip is made in a modern IC technology comprising one of: CMOS, JFET, P- or N-type MOSFET, and MESFET.

5. The preamplifier circuit according to claim 1, wherein the capacitor is a low leakage, floating plates type made as a polysilicon-to-polysilicon capacitor compatible with modem IC technology.

6. The preamplifier circuit according to claim 1, wherein the capacitor is a low leakage, floating plates type made as a polysilicon-to-metal capacitor compatible with modem IC technology.

7. The preamplifier circuit according to claim 1, wherein the capacitor is a low leakage, floating plates type made as a metal-to-polysilicon capacitor compatible with modem IC technology.

8. The preamplifier circuit according to claim 1, wherein the capacitor is a low leakage, floating plates type made as a metal-to-metal capacitor compatible with modern IC technology.

9. The preamplifier circuit according to claim 1, wherein the capacitor is a low leakage, floating plates type made any combination of polysilicon or metal as one plate and any combination of resistive or conductive layer as second plate, all compatible with modem IC technology.

10. The preamplifier circuit according to claim 1, wherein the input impedance of the input amplifier stage is set as substantially equal to or greater than 100 GigaOhms.

11. The preamplifier circuit according to claim 1, wherein the impedance circuit, further includes a resistor, which sets the input impedance of the input amplifier stage.

12. The preamplifier circuit according to claim 1, wherein the preamplifier circuit amplifies an electric signal from an electret condenser microphone (ECM).

13. The preamplifier circuit according to claim 1, wherein the preamplifier circuit amplifies an electric signal from a silicon-based condenser microphone.

14. Miniature microphone comprising a preamplifier circuit according to claim 1.

* * * * *

UNITED STATES PATENT AND TRADEMARK OFFICE
CERTIFICATE OF CORRECTION

PATENT NO. : 7,110,560 B2  Page 1 of 1
APPLICATION NO. : 10/092613
DATED : September 19, 2006
INVENTOR(S) : Lars J. Stenberg It is certified that error appears in the above-identified patent and that said Letters Patent is hereby corrected as shown below:

Column 5, line 20, the text reading "modem IC technology" should be replaced with --modern IC technology.--

Column 5, lines 23-24, the text reading "modem IC technology" should be replaced with --modern IC technology.--

Column 5, lines 27-28, the text reading "modem IC technology" should be replaced with --modern IC technology.--

Column 6, lines 7-8, the text reading "floating plates type made any combination" should be replaced with --floating plates type made of any combination.--

Column 6, line 10, the text reading "modem IC technology" should be replaced with --modern IC technology.--

Signed and Sealed this

Sixth Day of March, 2007

JON W. DUDAS
*Director of the United States Patent and Trademark Office*